United States Patent [19]

Goerlach et al.

[11] Patent Number: 5,466,959
[45] Date of Patent: Nov. 14, 1995

[54] SEMICONDUCTOR DEVICE FOR INFLUENCING THE BREAKDOWN VOLTAGE OF TRANSISTORS

[75] Inventors: Alfred Goerlach, Kusterdingen; Hartmut Michel, Reutlingen; Anton Mindl, Tuebingen, all of Germany

[73] Assignee: Robert Bosch GmbH, Stuttgart, Germany

[21] Appl. No.: 349,720

[22] Filed: Dec. 5, 1994

[30] Foreign Application Priority Data

Dec. 17, 1993 [DE] Germany ............... 43 43 140.2

[51] Int. Cl.⁶ .................. H01L 29/72; H01L 29/40
[52] U.S. Cl. .................. 257/361; 257/488; 257/489; 257/490; 257/572; 257/577
[58] Field of Search .................. 257/491, 488, 257/487, 489, 490, 495, 361, 363, 577, 572

[56] References Cited

U.S. PATENT DOCUMENTS 4,618,875  10/1986  Flohrs ........................ 357/46
4,916,494   4/1990  Flohrs et al. ................ 257/491

FOREIGN PATENT DOCUMENTS

3227536A1  7/1983  Germany .
4039662A1  6/1992  Germany .

OTHER PUBLICATIONS

No Author, "New Products Review for Wescon," Texas Instruments, Texas, 1964, p. 11.
Camenzind et al., "IC's Break Through The Voltage Barrier," *Electronics*, Mar. 31, 1969, pp. 90–94.

*Primary Examiner*—William Mintel
*Attorney, Agent, or Firm*—Kenyon & Kenyon

[57] ABSTRACT

A semiconductor device for influencing the breakdown voltage of a transistor with a surface electrode arranged over a space charge region, separated from the same by an oxide layer. The surface electrode is at a potential, as determined by a voltage divider, between the potentials of the base and collector of the transistor. The surface electrode includes two electrode plates insulated from one another, with the first electrode plate extending over a junction between a highly doped n⁺ collector region and a lightly doped n⁻ collector region, and a junction between the lightly doped n⁻ collector region and a p-type base region. The second electrode plate is bonded partly over the oxide layer and partly with the highly doped n⁺ collector region.

8 Claims, 2 Drawing Sheets

SEMICONDUCTOR DEVICE FOR INFLUENCING THE BREAKDOWN VOLTAGE OF TRANSISTORS

FIELD OF THE INVENTION

The present invention relates to a semiconductor device. More specifically, the present invention relates to a semiconductor device for influencing the breakdown voltage of transistors.

BACKGROUND OF THE INVENTION

A voltage limiting semiconductor device is described in German Published Patent Application No. 32 27 536. That reference describes a metallic surface electrode insulated by an oxide layer, which electrode is located over a space charge region of the transistor. The surface electrode is at a potential, determined by a voltage divider, between the potentials of the base and collector of the transistor. By introducing an $n^+$ type zone, which partially extends under the surface electrode, a space charge region extending in a slightly doped $n^-$ region can be restricted to the areas under the surface electrode by applying a cutoff voltage U between the transistor's base and collector. The breakdown voltage is then basically determined by this potential and the thickness of the oxide layer.

The voltage divider in the device of the aforementioned reference is formed by two monolithically integratable resistors, R1 and R2. The breakdown voltages that can be achieved between the base and collector in the case where R1 and R2 are respectively set to zero are designated U2 and U1, respectively. U2 designates the enhancement breakdown voltage and U1 the depletion breakdown voltage. To monolithically integrate the voltage divider consisting of R1 and R2, a voltage dividing resistor is formed within the lightly doped $n^-$ collector region. Since the breakdown voltage does not depend on the current density, the thickness of the oxide layer over the slightly doped $n^-$ collector region, located between the base and an included highly doped $n^+$ region, is selected to be smaller than in the remaining area. Thus it is achieved that the depletion breakdown does not occur in the regions adjacent to the voltage dividing resistor. The maximum achievable breakdown voltage U is U1+U2 when the condition R1/R2=U1/U2 is met. Since the thermal oxide layers normally used in planar processes cannot be made arbitrarily thick, the maximum achievable breakdown voltage is limited when such an arrangement is used.

According to German Published Patent Application No. 40 39 662, the breakdown voltage U can be increased by dividing the surface electrodes into two metallic areas. In this case, the surface electrode which fully covers the high-resistance, lightly doped $n^-$ collector region is replaced by a metallic layer which does not fully cover the collector region. The metallic layer covers only the junction zone between the lightly doped $n^-$ collector region and a highly doped $n^+$ collector region and is connected to the aforementioned voltage divider between the base and collector. A pn junction between the high-resistance lightly-doped $n^-$ collector region and the base region is covered by a second metallic plate which is at the base, or emitter, potential. It is thus achieved that no enhancement breakdown occurs.

When a cutoff voltage is applied between the base and collector, the breakdown voltage that can be achieved between the base and collector, for R2=0, is U1. Thus U1 is the depletion breakdown voltage identical to that of the surface electrode known from German Published Patent Application No. 32 27 536. The breakdown voltage between the base and collector is in this case the depletion breakdown voltage U1, stepped up by the voltage divider formed by resistors R1 and R2; i.e., U=U1×(1+R2/R1). The maximum achievable breakdown voltage U between the base and collector is thus no longer influenced by the enhancement breakdown voltage U2. The upper limit of the breakdown voltage is in this case limited only by the cutoff capacity of the pn junction between the base and the lightly doped $n^-$ collector region.

Known surface electrode devices have the disadvantage that there is a potential difference of about 150–250 V between the highly doped $n^+$ collector region not covered by the oxide layer, in the trough area, and the adjacent surface electrode. If the semiconductor device is damaged or contaminated with ions at the edges, for example, during assembly or operation, short-circuits or leakage currents may appear in the trough region between the surface electrode and the $n^+$ region. This results in operational failure of the semiconductor device. Additionally, in unpassivated components, spark-over may occur in the trough region between the surface electrode and the $n^+$ region, leading to weakening of the oxide layer and thus to component failure.

SUMMARY OF THE INVENTION

The semiconductor device of the present invention, in contrast to known devices, has the advantage that a potential difference between an edge area of the semiconductor device and the surface electrode is avoided and, thus, increased strength of the semiconductor device against chip damage and surface contamination is achieved. In addition, a novel, compact integration of a voltage divider resistor with a high cutoff voltage is possible in accordance with the present invention.

The device of the present invention includes a surface electrode which comprises first and second electrode plates insulated from each other, with the first electrode plate covering a junction between a highly doped $n^+$ collector region and a lightly doped $n^-$ collector region and the second electrode plate covering a junction between a lightly doped $n^-$ collector region and a p-doped base region. Additionally, the device of the present invention includes a voltage divider comprising a first resistor coupled between the collector and the second electrode plate and a second resistor coupled between the base and the second electrode plate.

The device of the present invention has the advantage that when a cutoff voltage is applied between the base and collector, the breakdown voltage of the voltage divider formed by the resistors corresponds to a stepped-up depletion voltage. Moreover, there is no potential difference between the second electrode plate and the highly doped $n^+$ collector region. Thus the occurrence of short-circuits or leakage currents between the electrode and the highly doped $n^+$ collector region can be avoided.

DETAILED DESCRIPTION OF THE DRAWINGS

Figure 1:
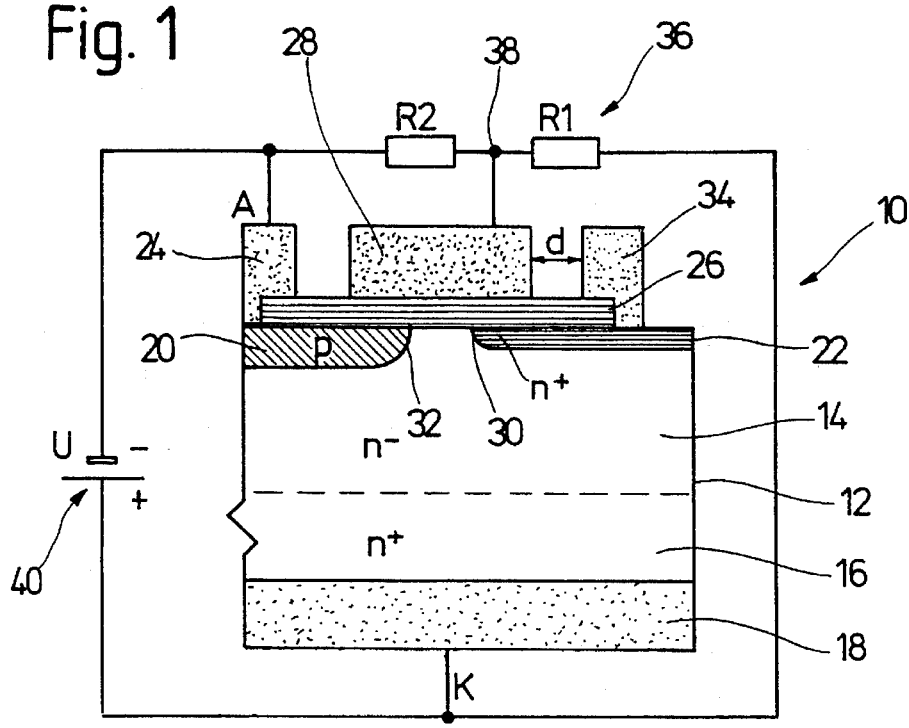
FIG. 1 shows a partial section of a semiconductor device, in accordance with the present invention, for limiting internal voltage.

FIG. 1 shows a semiconductor device 10, in accordance with the present invention, fabricated by planar technology. The semiconductor device 10 comprises a silicon chip 12, with a lightly doped n⁻ region 14 and a highly doped n⁺ region 16. The n⁺ region 16 is bonded with a metallic layer 18 which is provided with a collector terminal K. A p region 20 and a highly doped n⁺ region 22 are diffused, in a well-known manner, into the n⁻ region 14. The p region 20 is bonded with an electrode 24 which is provided with a base connector terminal A. For the sake of clarity, a highly doped n⁺ emitter region, included in the base zone of a bipolar transistor, is not shown. The n⁺ region 22 can be diffused together with the emitter doping.

An oxide layer 26 is applied on the silicon chip 12, extending over the p region 20, the n⁻ region 14, which extends to the surface of the silicon chip 12, and the n⁺ region 22. On top of the oxide layer 26, there is a first electrode plate 28 which extends over a junction 30 between the n⁺ region 22 and the n⁻ region 14 as well as a junction 32 between the n⁻ region 14 and the p region 20. A second electrode plate 34 is located partially above the oxide layer 26 and is partially bonded with the n⁺ region 22. The electrode plates 28 and 34 are at a distance d from one another. The electrode plate 28 is electrically insulated, by the oxide layer 26, from the underlying areas 20, 14 and 22 of the silicon chip 12.

A voltage divider 36 with resistors R1 and R2, is coupled between the base terminal A and the collector terminal K. A node 38, coupled between the resistors R1 and R2, is coupled to the electrode plate 28. A cutoff voltage U can be applied across the collector and base terminals via a voltage supply 40.

The operation of the semiconductor device of FIG. 1 will now be described. If the cutoff voltage U is applied between the base terminal A and the collector terminal K by the voltage supply 40, the highly doped n⁺ region 22 limits the space charge region extending in the n⁻ region 14 to the areas under the electrode plate 28. The breakdown voltages that can be achieved between the base terminal A and the collector terminal K are U2, when R1=0, and U1, when R2=0. U2 is the enhancement breakdown voltage and U1 is the depletion breakdown voltage of the semiconductor device 10. The breakdown voltage between the base terminal A and the collector terminal K is the depletion breakdown voltage U1 stepped up by the voltage divider 36 formed by the resistors R1 and R2. Thus, the formula for the breakdown voltage U is as follows:

$$U=U1\times(1+R2/R1).$$

Because the electrode plates 28 and 34 are insulated from one another, the n⁺ region 22 has the same potential as the electrode plate 34. Thus no potential difference can arise between the edge of the silicon chip 12 and the electrode plate 34, which could result in short-circuits or leakage currents between the electrode arrangement consisting of the electrode plates 28 and 34, and the n⁺ region 22. Thus the operating reliability of the semiconductor device 10 of the present invention is considerably enhanced. The distance d between the electrode plates 28 and 34 must be selected so that no electric spark-over can occur between them. In addition, the entire surface of the semiconductor device 10 can be covered with a passivating layer, not shown in FIG. 1.

Figure 2:
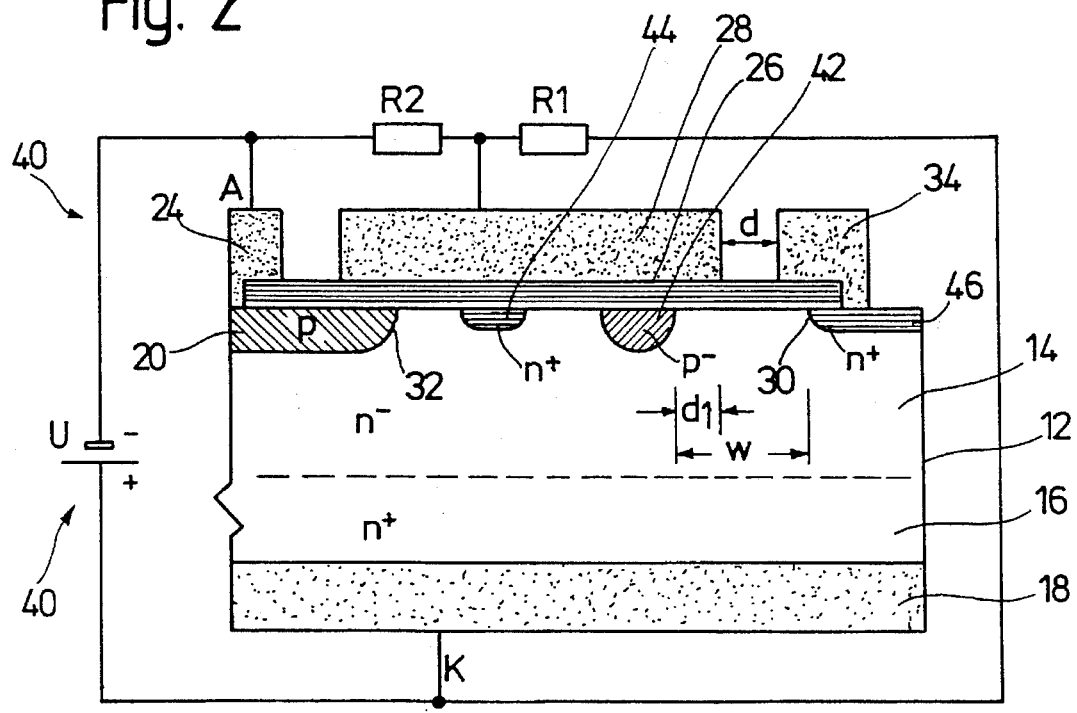
FIG. 2 shows a partial section of a semiconductor device, in accordance with the present invention, for limiting internal voltage with an integrated voltage divider.

FIG. 2 shows another semiconductor device 40, in accordance with the present invention, with a monolithically integrated voltage divider. Parts that are identical to those of FIG. 1 are designated with the same numbers and are not explained again. As shown in FIG. 2, a voltage divider resistor 42 is under the oxide layer 26 as a lightly-doped p region. The voltage divider resistor 42 is embedded in the n⁻ region 14 and is located between an n⁺ region 44 and an n⁺ region 46. As breakdown voltage U is independent of the current density, oxide layer 26 over the n⁻ region 14 must be less thick in the area between the p region 20 and the n⁺ region 44 than in the other areas. Thus it is achieved that depletion breakdown does not occur in the n⁻ region 14 adjacent to the voltage divider resistor 42. The reduction in the thickness of the oxide layer 26 in this area is not shown in FIG. 2 for the sake of clarity.

The electrode plate 28 spans over the junction 32, the n⁺ region 44 and the voltage divider resistor as well as those parts of the n⁻ region 14 inbetween, and extends from over the p region 20 to over that part of the n⁻ region 14 between the voltage divider resistor and the n⁺ region 46. The electrode plate 28 overlaps the voltage divider resistor 42 by a distance d1. The voltage divider resistor 42 and the n⁺ region 46 are separated by a distance w.

The electrode plate 34 is partly located on the oxide layer 26 and partly bonded with the n⁺ region Since the electrode plate 34 again has the same potential as the n⁺ region 46, no potential difference arises between the edge of the silicon chip 12 and the electrode plate 34 to cause the above-mentioned disadvantages.

The distances d1 and w must be selected so that during doping of the n⁻ region 14, the voltage divider resistor 42, and the n⁺ region 46, and for a given thickness of oxide layer 26, the cutoff voltage of the voltage divider resistor 42 in relation to the cathode terminal K is greater than the breakdown voltage U. The distance d between the electrode plates 28 and 34 is again chosen so that no spark-over can occur.

Figure 3:
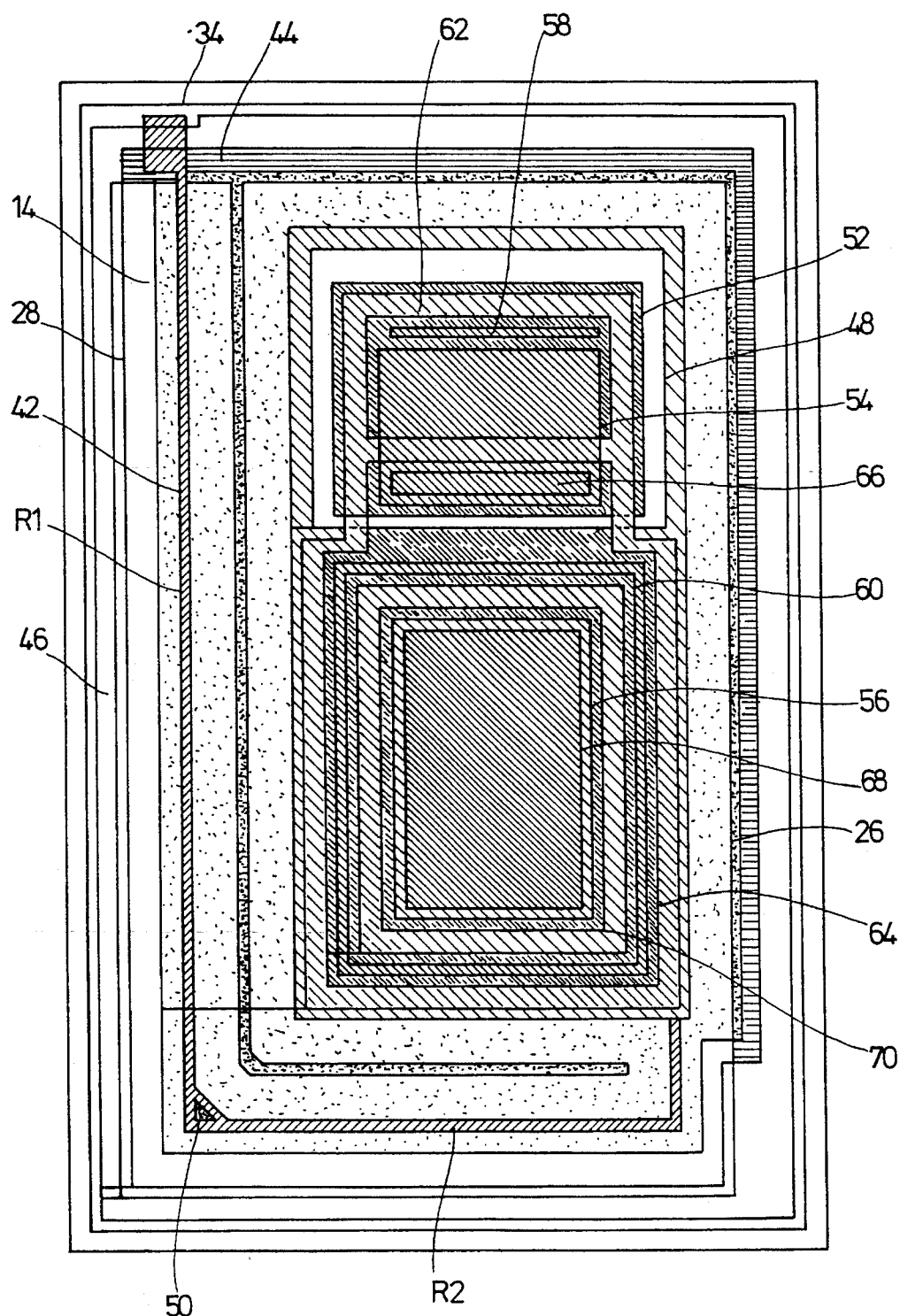
FIG. 3 shows a top view of a semiconductor device in accordance with the present invention.

FIG. 3 shows a top view of the semiconductor device 40 shown in FIG. 2, which has an internal voltage limiter with an integrated voltage divider on a planar NPN Darlington transistor. Parts that are identical to those of FIG. 2 are designated with the same reference numbers and are not explained again.

The voltage divider resistor 42 forms an elongated p-zone diffused into the silicon chip from the main surface. The surface concentration of the p-resistor is about $1.5\times10^{17}$ cm⁻³. The penetration depth of the resistor 42 into the high-resistance, 60 Ohm·cm n⁻ region 14 is about 31 μm (this corresponds to a characteristic length, σ, i.e., $$\sigma = 2\sqrt{Dt} ,$$

equal to 11 μm). The resistor 42 is separated from the n⁺ region 46 by the distance w, which in this embodiment is 125 μm. For the n⁺ region 46, a surface concentration of $10^{20}$ cm⁻³ is selected for a characteristic length σ of 3.6 μm. The thickness of the oxide layer 26 is 2 μm. At the end of this manufacturing process, the distances d and d1, shown in FIG. 2, are 50 μm and 40 μm, respectively. A highly doped n⁺ region 44 is located between the voltage divider resistor 42 and a base region 48 of the output stage. The electrode plate 28, electrically separated from the silicon chip 12 by the oxide layer 26, is located above the base region 48 and is connected to the voltage divider resistor 42 through a bonding hole 50. At the collector end of the voltage divider, the voltage divider resistor 42 is connected to the n⁺ region 44 over the outer electrode plate 34.

A driver base 52 is shown in FIG. 3. The areas designated 54 and 56 represent emitter regions of the driver and of the output stage, respectively. The base areas are connected to base metal plating 62 and 64, via contact windows 58 and 60, respectively. Emitter contact windows 66 and 68, as well as emitter metal plating 70 of the output stage, are also shown in FIG. 3. For the sake of clarity, the leakage resistors, miscellaneous oxide thicknesses, reverse-conducting diodes, temperature compensation means, lateral transistors, etc. are not shown in FIG. 3.

In the device shown in FIGS. 2 and 3, the cutoff capacity of the voltage divider resistor 42 is significantly higher than the breakdown voltage U set according to the above-shown equation. The following table shows the results of a two-dimensional device simulation for different surface charge densities, which elucidate the results that can be achieved.

| Surface Charge Density (cm$^{-2}$) | Depletion breakdown voltage (V) | Voltage divider resistor breakdown voltage (V) |
| --- | --- | --- |
| 0 | 187 | 884 |
| $+2 \times 10^{11}$ | 205 | 869[1] |
| $-2 \times 10^{11}$ | 168 | 945[2] |

[1] Plus error compensation of the metallic zones by 10 μm in the direction of the base region 20.
[2] Plus error compensation of the metallic zones by 10 μm in the direction of the trough 46.

The present invention is not limited to the embodiments shown in FIGS. 1 through 3. For example, a reverse doping sequence is also possible, in which the n$^-$ region 14 is p-doped, or the p type region 20 is n-doped, etc. The semiconductor device of the present invention is also suitable for diodes, in addition to transistors.

What is claimed is:

1. A semiconductor device for influencing a breakdown voltage of a transistor, comprising:

a surface electrode arranged over a space charge region of a silicon chip, the surface electrode having a potential between a base and a collector determined by a voltage divider; and an oxide layer separating the surface electrode and the space charge region;

wherein the surface electrode includes first and second electrode plates insulated from one another, with:

the first electrode plate extending over a first junction between a first n$^+$ collector region and an n$^-$ collector region of the silicon chip, over the n$^-$ collector region, and over a second junction between the n$^-$ collector region and a p-type base region; and the second electrode plate being bonded partly over the oxide layer and partly with the first n$^+$ collector region.

2. The semiconductor device according to claim 1, wherein the electrode plates are ring-shaped.

3. The semiconductor device according to claim 1, wherein the second electrode plate is entirely over the n$^+$ collector region.

4. The semiconductor device according to claim 1, wherein the voltage divider is monolithically integrated with a voltage divider resistor embedded under the oxide layer between the first n$^+$ collector region and a second n$^+$ collector region at a first distance from the first n$^+$ collector region.

5. The semiconductor device according to claim 4, wherein the first electrode plate overlaps the voltage divider resistor by a second distance and ends over the n$^-$ collector region between the voltage divider resistor and the first n$^+$ collector region.

6. The semiconductor device according to claim 5, wherein the first and second distances are such that a cutoff voltage of the voltage divider resistor is greater than the breakdown voltage, for a given doping process of the n$^-$ collector region, the first n$^+$ collector region, and the voltage divider resistor.

7. The semiconductor device according to claim 4, wherein the first electrode plate is coupled to the voltage divider resistor via a bonding window through the oxide layer.

8. The semiconductor device according to claim 1, wherein the first and second electrode plates and an area between the first and second electrode plates are provided with an electrically insulating passivating layer.

* * * * *